(12) United States Patent
Daoud

(10) Patent No.: US 6,319,018 B1
(45) Date of Patent: Nov. 20, 2001

(54) CIRCUIT BOARD ELECTRICAL AND PHYSICAL CONNECTION SYSTEM AND METHOD

(75) Inventor: Bassel Hage Daoud, Parsippany, NJ (US)

(73) Assignee: Avaya Technology Corp., Basking Ridge, NJ (US)

( * ) Notice: Subject to any disclaimer, the term of this patent is extended or adjusted under 35 U.S.C. 154(b) by 0 days.

(21) Appl. No.: 09/515,401

(22) Filed: Feb. 29, 2000

(51) Int. Cl.$^7$ .................................................. H01R 9/09
(52) U.S. Cl. ............................................. 439/65; 439/801
(58) Field of Search ............................. 379/399; 439/65, 439/76.1, 801

(56) References Cited

U.S. PATENT DOCUMENTS

| | | | |
|---|---|---|---|
| 2,980,878 | * 4/1961 | Swengel | 439/55 |
| 4,577,918 | * 3/1986 | Kasdagly | 439/66 |
| 5,018,192 | * 5/1991 | Smith | 379/107 |
| 5,355,282 | * 10/1994 | Yokemura et al. | 361/760 |

* cited by examiner

Primary Examiner—Brian Sircus
Assistant Examiner—Thanh-Tam Le
(74) Attorney, Agent, or Firm—Birch, Stewart, Kolasch & Birch, LLP

(57) ABSTRACT

A system and method of establishing an electrical connection between first and second circuit boards includes the use of a multi-function fastener. The fastener is inserted between the circuit boards and serves to physically connect the circuit boards to each other and to a support or base. The fastener bears against conductive edge portions of the first and second circuit boards to also establish electrical conductivity between the circuit boards. Fasteners may be provided to communicate a grounding voltage, as well as, a power supply voltage. By providing a series of circuit boards and fasteners, it is possible to establish common ground and power supply voltage levels in multi-circuit board assemblies, without providing separate ground and power supply bars.

27 Claims, 6 Drawing Sheets

CIRCUIT BOARD ELECTRICAL AND PHYSICAL CONNECTION SYSTEM AND METHOD

BACKGROUND OF THE INVENTION

1. Field of the Invention

The present invention relates to electrical and physical connections of circuit boards.

2. Description of the Relevant Art

Often a single electronic device will include multiple circuit boards. Each circuit board is firmly attached within a housing of the electronic device. Further, each circuit board is electrically connected to a common ground voltage, and usually to a common power supply voltage, such as 5 volts. In order to establish the common ground voltage and common supply voltage for the multiple circuit boards, it is common to provide a grounding bar and a power supply bar.

FIGS. 1 and 2 illustrate an electrical assembly in accordance with the background art, such as a network interface device (NID), as commonly employed in the telecommunications art. In FIGS. 1 and 2, an electrical box of the NID includes a base 1 and a cover 2. The cover 2 is attached to the base 1 by a hinge 3. FIG. 1 is a top view, illustrating the NID with its cover 2 open, providing access to the contents of the base 1. FIG. 2 is a cross sectional view illustrating the NID with its cover 2 closed.

Inside the base 1, a grounding bar 4 is connected to a floor of the base 1, via first screws 5. A power supply bar 6 is connected to the floor of the base 1, via second screws 7. Electrical conductivity does not exist between the grounding bar 4 and power supply bar 6. A plurality of first threaded studs 8 extend away from an upper surface of the grounding bar 4. Likewise, a plurality of second threaded studs 9 extend away from an upper surface of the power supply bar 6.

A plurality of circuit boards 10, such as printed circuit boards, are attached between the grounding bar 4 and the power supply bar 6. Each circuit board 10 includes a first through hole 11 surrounded by a first electrically conductive ring 12 and a second through hole 13 surrounded by a second electrically conductive ring 14. One of the first threaded studs 8 is passed through the first through hole 11, and one of the second threaded studs 9 is passed through one of the second through holes 13. A first washer 15 and first nut 16 are applied to the first threaded stud 8. Likewise, a second washer 17 and second nut 22 are applied to the second threaded stud 9.

As illustrated in FIG. 1, a first wire 18 is passed through a first port 19 formed by the base 1 and cover 2. The first wire 18 is electrically connected to the grounding bar 4, via one of the first screws 5, or one of the first nuts 16. The first wire 18 provides the common grounding voltage. A second wire 20 is passed through a second port 21 formed by the base 1 and cover 2. The second wire 20 is electrically connected to the power supply bar 6, via one of the second screws 7, or one of the second nuts 22. The second wire 20 provides the common power supply voltage.

By the arrangement of FIGS. 1 and 2, each printed circuit board 10 is firmly connected to the base 1. Also, a common ground voltage and a common power supply voltage are provided to the first electrically conductive ring 12 and the second electrically conductive ring 14 of each printed circuit board 10, respectively.

The arrangement of FIGS. 1 and 2 suffers drawbacks. The grounding bar 4 and power supply bar 6 are bulky and rather expensive. Therefore, the overall size of the NID be enlarged to accommodate the grounding bar 4 and the power supply bar 6. Further, the overall cost of manufacturing the NID must be increased by the material costs of the grounding bar 4 and the power supply bar 6, as well as, by the labor costs associated with installing the grounding bar 4 and the power supply bar 6.

SUMMARY OF THE INVENTION

It is an object of the present invention to overcome one or more of the drawbacks associated with the background art.

It is a further object of the present invention to provide a system and method of grounding and/or powering multiple circuit boards which is less expensive and/or less labor intensive.

It is an additional object of the present invention to provide a system and method of grounding and/or powering multiple circuit boards which consumes less space within an enclosure, housing the circuit boards.

These and other objects are accomplished by providing an electrical assembly comprising a base; a first circuit board disposed on said base; a first electrically conductive portion associated with said first circuit board; a second circuit board disposed on said base; a second electrically conductive portion associated with said second circuit board; a first fastener located between said first circuit board and said second circuit board and attaching said first circuit board to said second circuit board; and a third electrically conductive portion associated with said first fastener electrically connecting said first conductive portion to said second conductive portion.

Further, these and other objects are accomplished by providing an electrical assembly comprising: a circuit board having a first surface, a first edge and a second edge; a first electrically conductive portion formed on said first surface; a first cutout formed along said first edge adjacent said first electrically conductive portion; and a second cutout formed along said second edge adjacent said first electrically conductive portion.

Moreover, these and other objects are accomplished by a method of forming an electrical assembly comprising the steps of: providing a base, a first circuit board with a first electrically conductive portion, a second circuit board with a second electrically conductive portion, and a first fastener with a third electrically conductive portion; disposing the first and second circuit boards on the base, inserting the first fastener between the first and second circuit boards; and contacting the third electrically conductive portion with the first and second electrically conductive portions to establish a common circuit.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Figure 3:
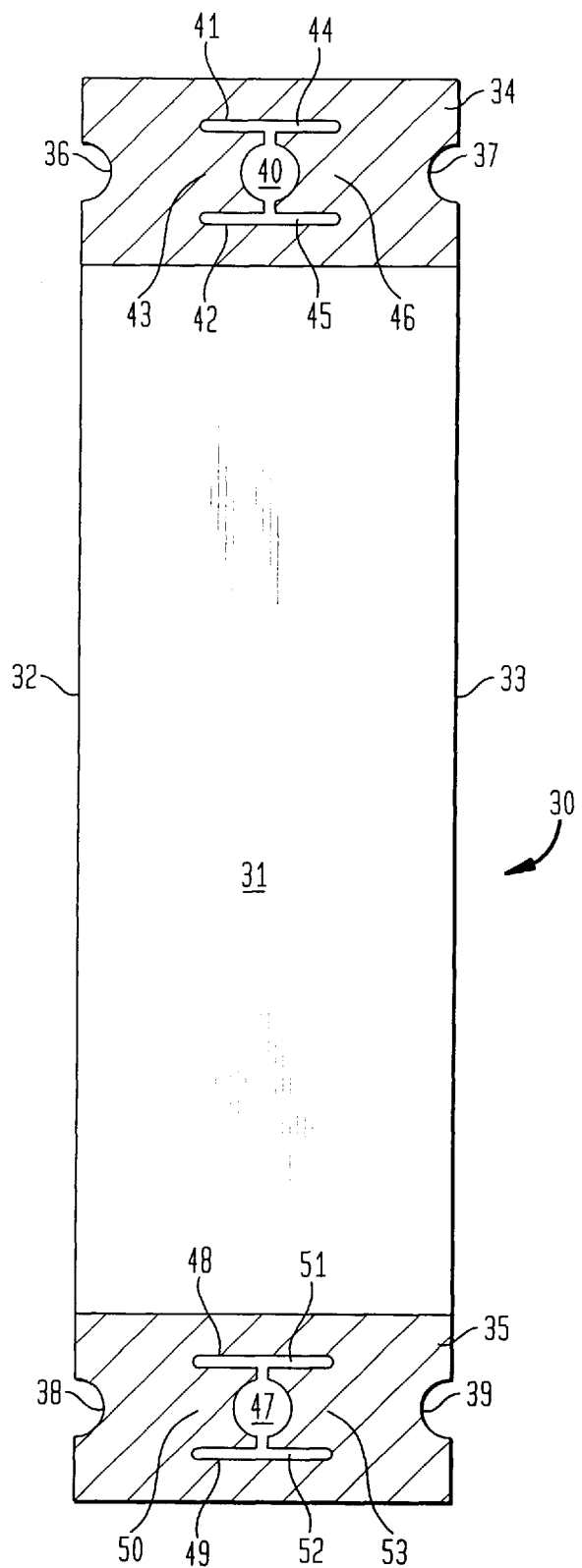
FIG. 3 is a top view of a circuit board, in accordance with the present invention.

With reference to FIG. 3, a circuit board 30, in accordance with the present invention, includes a first surface 31, a first edge 32 and a second edge 33. A first electrically conductive portion 34 is formed on the first surface 31 at a first end of the circuit board 30. A second electrically conductive portion 35 is formed on the first surface 31 at a second end of the circuit board 30. The first and second electrically conductive portions 34, 35 may be metallic traces formed on, or applied to, the first surface 31 of the circuit board 30.

A first cutout 36 is formed along the first edge 32 adjacent to the first electrically conductive portion 34. A second cutout 37 is formed along the second edge 33 adjacent to the first electrically conductive portion 34. A third cutout 38 is formed along the first edge 32 adjacent to the second electrically conductive portion 35. A fourth cutout 39 is formed along the second edge 33 adjacent to the second electrically conductive portion 35. The cutouts 36, 37, 38, 39 are illustrated as semi-circular in shape, however it should be noted that other shapes may also be suitable.

Inside the first electrically conductive portion 34, there is provided a first through hole 40. A first through slot 41 and a second through slot 42 are provided adjacent to the first through hole 40 and open into the first through hole 40. Residing between the first through slot 41 and the second through slot 42 is a first flexible portion 43 of the circuit board 30. A third through slot 44, fourth through slot 45 and second flexible portion 46 may be provided on an opposite side of the first through hole 40 in a mirror symmetrical fashion.

Inside the second electrically conductive portion 35, there is provided a second through hole 47. A fifth through slot 48 and a sixth through slot 49 are provided adjacent to the second through hole 47 and open into the second through hole 47. Residing between the fifth through slot 48 and the sixth through slot 49 is a third flexible portion 50 of the circuit board 30. A seventh through slot 51, eighth through slot 52 and fourth flexible portion 53 may be provided on an opposite side of the second through hole 47 in a mirror symmetrical fashion.

In application, a plurality of circuitry components (not illustrated), such as transistors, diodes, capacitors, and resistors, would be present upon the first, and perhaps a back surface of the circuit board 30. The circuitry components could be fill scale, or integrate components on a printed circuit board, such as employed in large scale integration (LSI) or very large scale integration (VLSI), etc. In order to power the circuitry components, a grounding voltage would be established at the first electrically conductive portion 34, and a power supply voltage, such as 5 volts, would be established at the second electrically conductive portion 35. Soldering, or printed metallic traces, would interconnect the appropriate circuitry components between the first electrically conductive portion 34 and the second electrically conductive portion 35.

Figure 2:
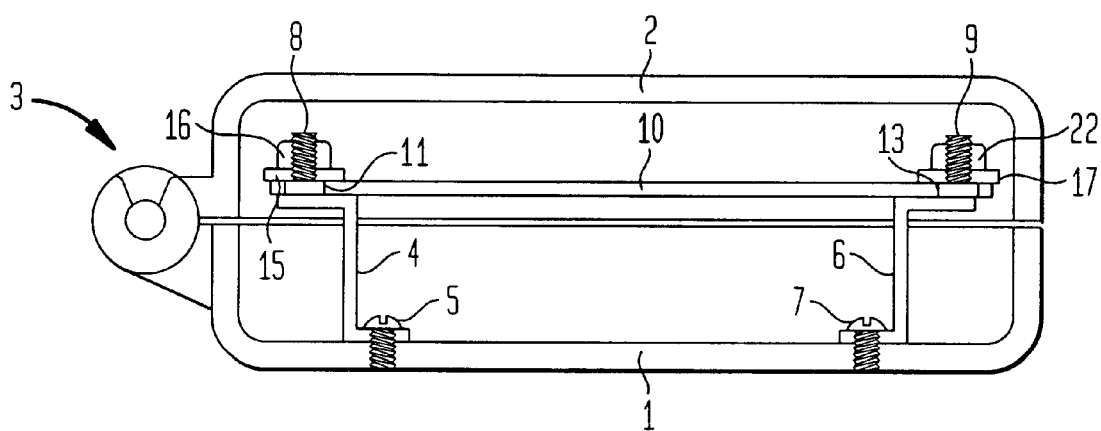
FIG. 2 is a cross sectional view illustrating the interconnections of FIG. 1.
Figure 4:
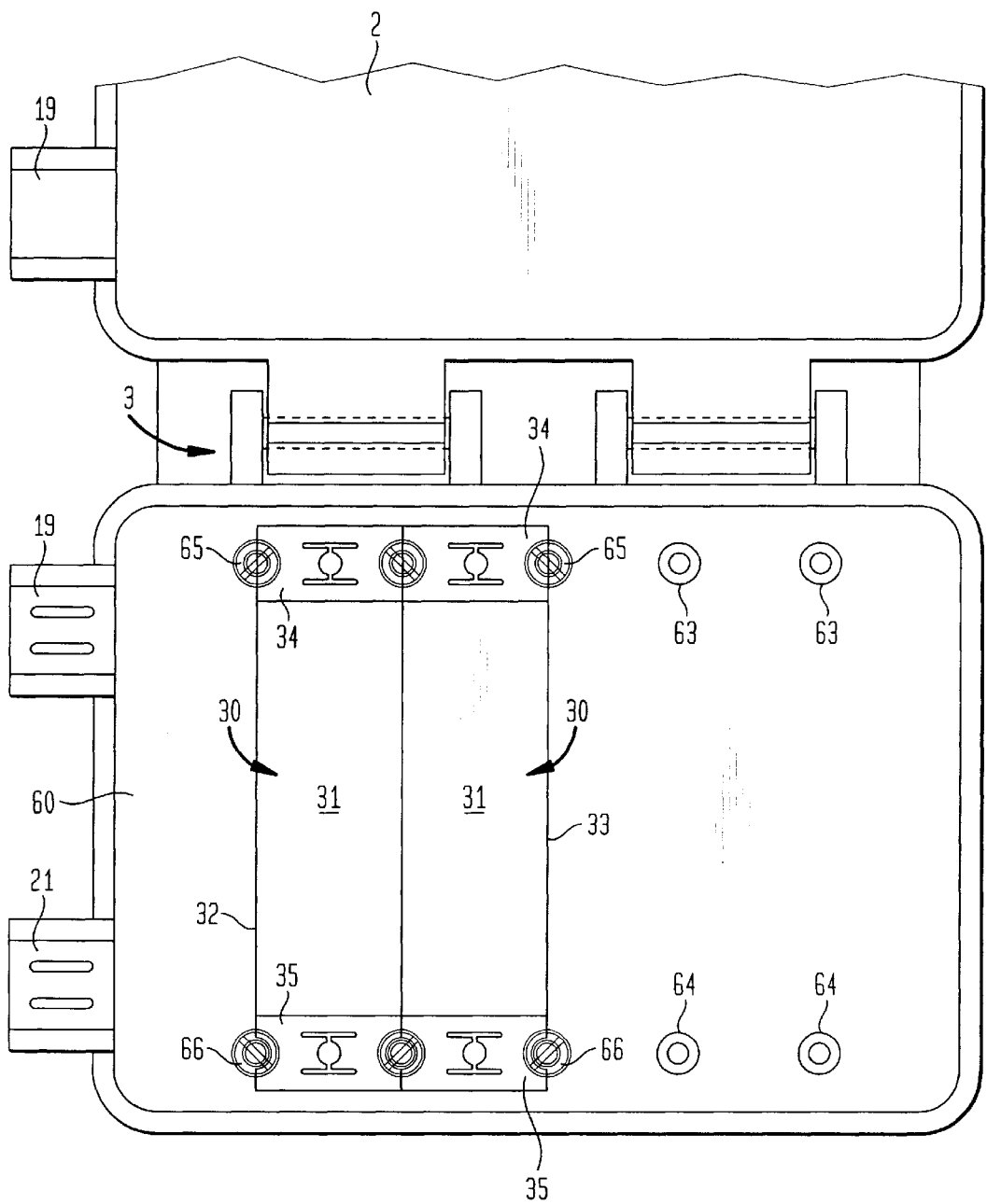
FIG. 4 is top view illustrating electrical and physical interconnections between multiple circuit boards, in accordance with the present invention.
Figure 5:
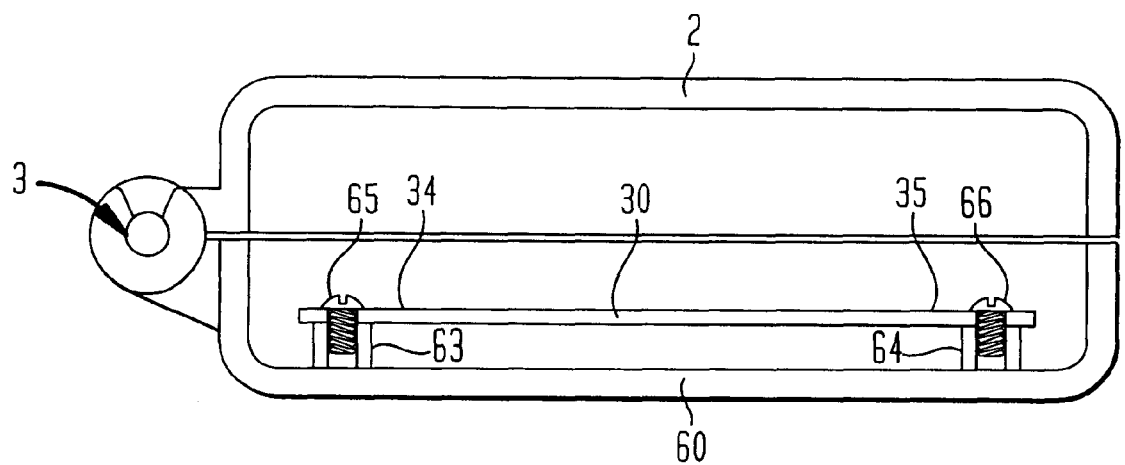
FIG. 5 is a cross sectional view illustrating the interconnections of FIG. 4.

Now, with reference to FIGS. 4 and 5, the interconnections of a plurality of circuit boards 30 will be explained. In FIG. 4, a modified electrical box of the NID includes a modified base 60 and the cover 2. The cover 2 is attached to the modified base 60 by the hinge 3. FIG. 4 is a top view, illustrating the NID with the cover 2 open, providing access to the contents of the modified base 60. FIG. 2 is a cross sectional view illustrating the NID with its cover 2 closed.

Inside the modified base 60, there is provided a first bank of threaded holes 63 and a second bank of threaded holes 64. When assembling the NID, the circuit boards 30 are laid side-by-side on the modified base 60, with a center of the cutouts 36, 37, 38, 39 being located above respective ones of the threaded holes 63, 64. First fasteners, such as first screws 65, are threaded into respective threaded holes of the first bank of threaded holes 63. Likewise, second fasteners, such as second screws 66, are threaded into respective threaded holes of the second bank of threaded holes 64.

Each of the first and second screws 65, 66 includes a threaded shaft and a third electrically conductive portion, such as a head constructed of an electrically conductive material. As illustrated in FIG. 5, once the first screws 65 are tightened down, the conductive heads will physically contact the first electrically conductive portions 34 of the circuit boards 30. The physical contact will secure the circuit boards 30 to the modified base 60, as well as, establish electrical conductivity between the first electrically conductive portions 34 of the circuit boards 30. Once the second screws 66 are tightened down, the conductive heads will physically contact the second electrically conductive portions 35 of the circuit boards 30. The physical contact will secure the circuit boards 30 to the modified base 60, as well as, establish electrical conductivity between the second electrically conductive portions 35 of the circuit boards 30.

Figure 6:
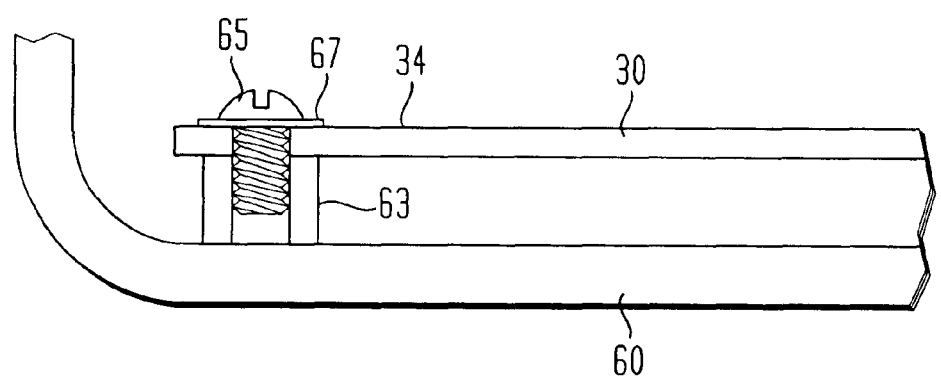
FIG. 6 is a cross sectional view illustrating an alternative embodiment for electrically interconnecting the circuit boards.

FIG. 6 is a close-up view of an alternative embodiment for the first fasteners. In FIG. 6, the third electrically conductive portion is a conductive washer 67, disposed under a head of the first screw 65. The conductive washer 67 establishes electrical conductivity between the first electrically conductive portions 34 of adjacent circuit boards 30. Therefore, in the first screws 65 need not be constructed of an electrically conductive material.

Figure 1:
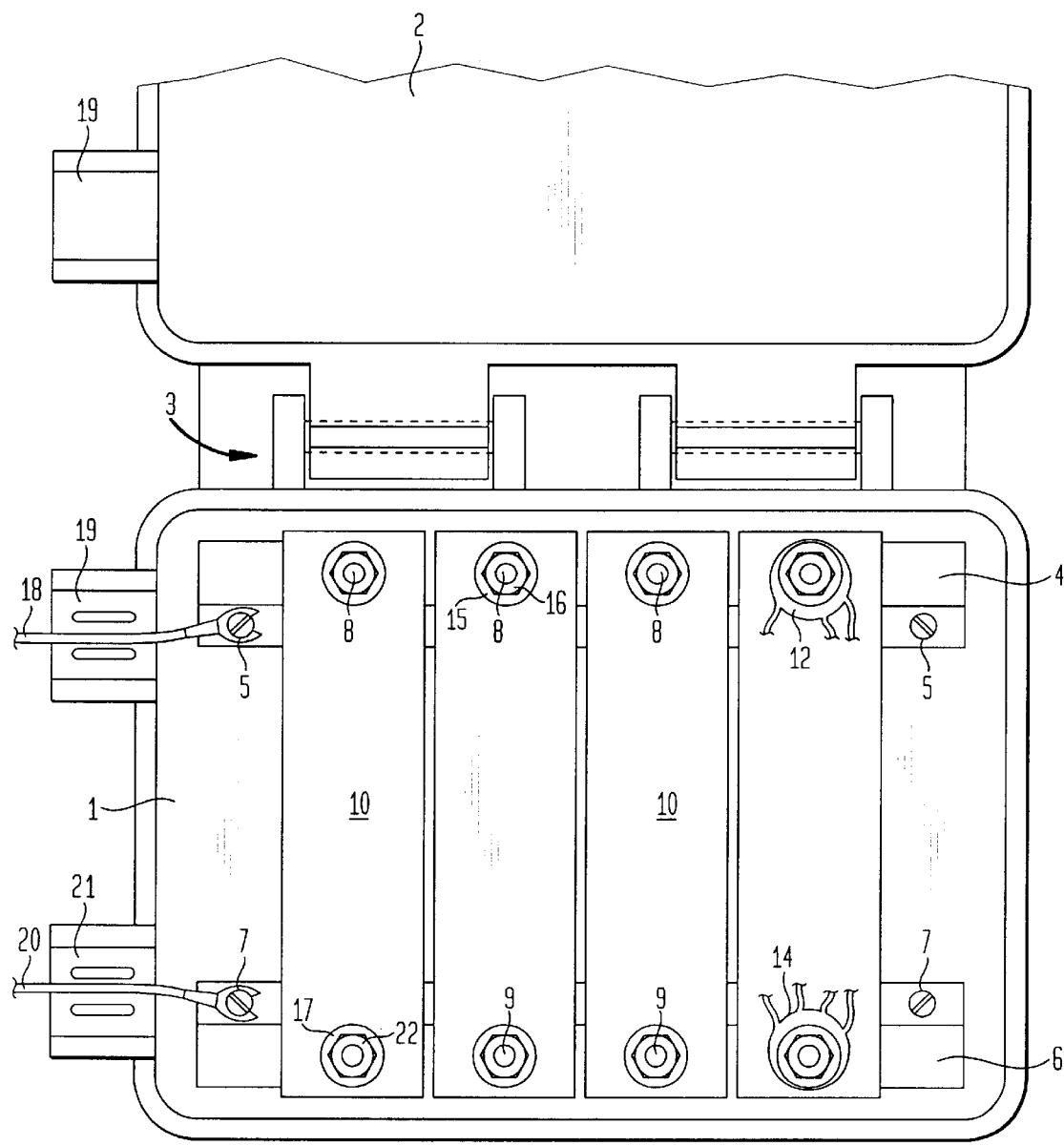
FIG. 1 is a top view illustrating electrical and physical interconnections between multiple circuit boards, in accordance with the background art.

As in FIG. 1, the first wire 18 is passed through the first port 19 formed by the modified base 60 and the cover 2. The first wire 18 must be electrically connected to the first electrically conductive portions 34 of the circuit boards 30, in order to provide a common grounding voltage. The second wire 20 is passed through the second port 21 formed by the modified base 60 and the cover 2. The second wire 20 must be electrically connected to the second electrically conductive portions 35 of the circuit boards 30, in order to provide a common power supply voltage.

Figure 7:
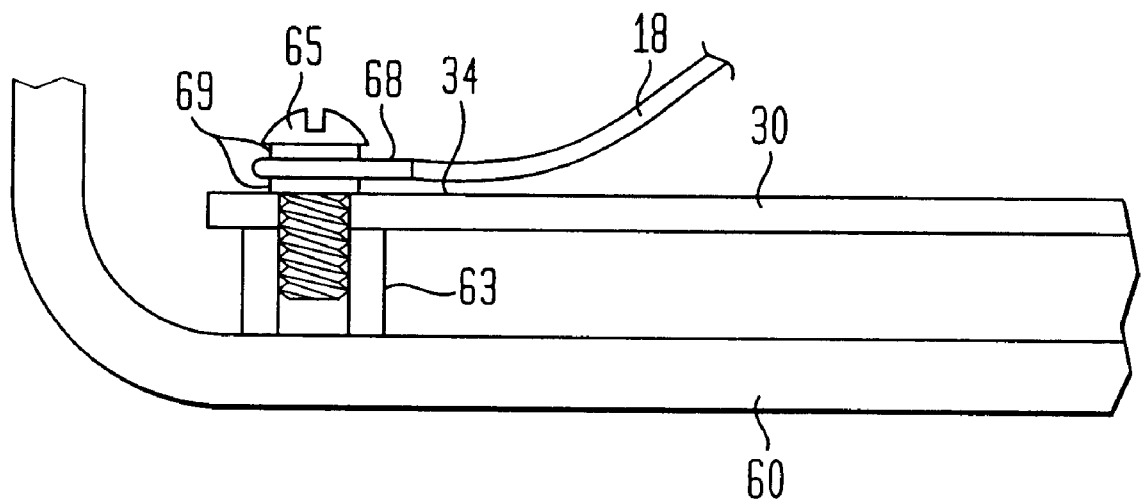
FIG. 7 is a cross sectional view illustrating a first embodiment for connecting a ground wire or power supply wire.

FIG. 7 illustrates a first embodiment for electrically connecting the first wire 18 to the first electrically conductive portions 34. A terminal 68 on an end of the first wire 18 is sandwiched between two conductive washers 69. One of the conductive washers 69 bears against a head of the first screw 65 and the other of the conductive washers 69 bears against the first electrically conductive portion 34 of one of the circuit boards 30. By tightening the first screw 65, electrical conductivity is established between the common ground voltage of the first wire 18 and the first electrically conductive portions 34. Of course, a similar arrangement could be employed to electrically connect the second wire 20 to the second electrically conductive portions 35.

Figure 8:
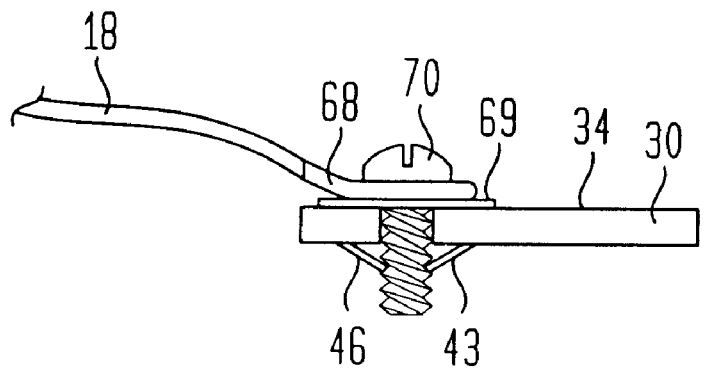
FIG. 8 is a cross sectional view illustrating a second embodiment for connecting a ground wire or power supply wire.

FIG. 8 illustrates a second embodiment for electrically connecting the first wire 18 to the first electrically conductive portions 34. The terminal 68 on the end of the first wire 18 is sandwiched between a conductive washer 69 and a head of a third fastener 70. The conductive washer 69 bears against the first electrically conductive portion 34 of one of the circuit boards 30. The third fastener 70 is threaded into the first through hole 40 (see FIG. 3) and tightened to establish electrical conductivity between the common ground voltage of the first wire 18 and the first electrically conductive portion 34. By the second embodiment, it is possible to use third fasteners 70 of various diameters, since the first and second flexible portions 43, 46 of the circuit board 30 will yield to accommodate the diameter of the third fastener 70. Of course, a similar arrangement could be employed to electrically connect the second wire 20 to the second electrically conductive portions 35.

Although screws have been illustrated as the first, second and third fasteners, it should be apparent after reading the disclosure, that other types of fasteners, such as snaps or specialty fasteners, could be used. Further, although the first and second electrically conductive portions have been illustrated at the ends of the circuit boards, it should be apparent that the present invention would be equally applicable if the conductive portions were place at other, consistent locations on the circuit boards.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An electrical assembly comprising:
   a base;
   a first circuit board disposed on said base;
   said first circuit board including a first electrically conductive portion
   a second circuit board disposed on said base;
   said second circuit board including a first electrically conductive portion;
   a first fastener located between said first circuit board and said second circuit board and attaching said first circuit board to said second circuit board; and
   said first fastener including a third electrically conductive portion electrically connecting said first conductive portion of said first circuit board to said first conductive portion of said second circuit board, wherein said first fastener includes a shaft and said third electrically conductive portion includes an electrically conductive head attached to said shaft.

2. The electrical assembly according to claim 1, wherein said first fastener also attaches said first circuit board and said second circuit board to said base.

3. The electrical assembly according to claim 1, further comprising:
   said first circuit board including a second electrically conductive portion;
   said second circuit board including a second electrically conductive portion;
   a second fastener located between said first circuit board and said second circuit board and attaching said first circuit board to said second circuit board; and
   said second fastener including a third electrically conductive portion electrically connecting said second electrically conductive portion of said first circuit board to said second electrically conductive portion of said second circuit board.

4. The electrical assembly according to claim 3, wherein said first fastener also attaches said first circuit board and said second circuit board to said base and said second fastener also attaches said first circuit board and said second circuit board to said base.

5. The electrical assembly according to claim 3, wherein said first electrically conductive portions are electrically connected to a ground voltage and said second electrically conductive portions are electrically connected to a power supply voltage different than said ground voltage.

6. The electrical assembly according to claim 1, wherein said shaft is a threaded shaft.

7. The electrical assembly according to claim 1, further comprising:
   a through hole formed in said first circuit board in said first electrically conductive portion for receiving an electrical connection.

8. The electrical assembly according to claim 7, further comprising:
   a first through slot formed in said first circuit board and opening into said through hole; and
   a second through slot formed in said first circuit board and opening into said through hole, wherein a portion of said first circuit board residing between said first through slot and said second through slot is flexible.

9. The electrical assembly according to claim 1, further comprising;
   a threaded hole formed in said base, and wherein said shaft is a threaded shaft and said threaded shaft engages within said threaded hole to attach said first circuit board and said second circuit board to said base.

10. The electrical assembly according to claim 1, wherein said first electrically conductive portion of said first circuit board is located adjacent to an end section of said first circuit board and said first electrically conductive portion of said second circuit board is located adjacent to an end section of said second circuit board.

11. The electrical assembly according to claim 10, wherein said end section of said first circuit board includes a first cutout portion adjacent to said first fastener and said end section of said second circuit board includes a second cutout section adjacent to said first fastener.

12. The electrical assembly according to claim 11, wherein said first cutout section and said second cutout section are semicircular in shape, respectively.

13. The electrical assembly according to claim 1, wherein said first conductive portion of said first circuit board is a metallic trace formed on a surface of said first circuit board and said first conductive portion of said second circuit board is a metallic trace formed on a surface of said second circuit board.

14. The electrical assembly according to claim 1, further comprising:

a cover attached to said base, and wherein said electrical assembly constitutes a network interface device.

15. A method of forming an electrical assembly comprising the steps of:

providing a circuit board with an electrically conductive portion;

providing a through hole in the electrically conductive portion, and a first through slot and a second through slot formed in the circuit board and each opening into the through hole;

screwing a threaded member into the through hole; and causing a deflection of a portion of the circuit board residing between the first through slot and the second through slot, as the threaded member is screwed into the through hole.

16. An electrical assembly comprising:

a base;

a first circuit board disposed on said base;

said first circuit board including a first electrically conductive portion;

a second circuit board disposed on said base;

said second circuit board including a first electrically conductive portion;

a first fastener located between said first circuit board and said second circuit board and attaching said first circuit board to said second circuit board; and said first fastener including a third electrically conductive portion electrically connecting said first conductive portion of said first circuit board to said first conductive portion of said second circuit board, wherein said first fastener includes a shaft and said third electrically conductive portion includes an electrically conductive washer disposed around said shaft.

17. The electrical assembly according to claim 16, wherein said first fastener also attaches said first circuit board and said second circuit board to said base.

18. The electrical assembly according to claim 16, further comprising:

said first circuit board including a second electrically conductive portion;

said second circuit board including a second electrically conductive portion;

a second fastener located between said first circuit board and said second circuit board and attaching said first circuit board to said second circuit board; and said second fastener including a third electrically conductive portion electrically connecting said second electrically conductive portion of said first circuit board to said second electrically conductive portion of said second circuit board, wherein said first fastener also attaches said first circuit board and said second circuit board to said base and said second fastener also attaches said first circuit board and said second circuit board to said base.

19. The electrical assembly according to claim 18, wherein said first electrically conductive portions are electrically connected to a ground voltage and said second electrically conductive portions are electrically connected to a power supply voltage different than said ground voltage.

20. The electrical assembly according to claim 16, wherein said shaft is a threaded shaft.

21. The electrical assembly according to claim 16, further comprising:

a through hole formed in said first circuit board in said first electrically conductive portion for receiving an electrical connection.

22. The electrical assembly according to claim 21 further comprising:

a first through slot formed in said first circuit board and opening into said through hole; and a second through slot formed in said first circuit board and opening into said through hole, wherein a portion of said first circuit board residing between said first through slot and said second through slot is flexible.

23. The electrical assembly according to claim 16, further comprising;

a threaded hole formed in said base, and wherein said shaft is a threaded shaft engaging within said threaded hole to attach said first circuit board and said second circuit board to said base.

24. The electrical assembly according to claim 16, wherein said first electrically conductive portion of said first circuit board is located adjacent to an end section of said first circuit board and said first electrically conductive portion of said second circuit board is located adjacent to an end section of said second circuit board.

25. The electrical assembly according to claim 24, wherein said end section of said first circuit board includes a first cutout portion adjacent to said first fastener and said end section of said second circuit board includes a second cutout section adjacent to said first fastener.

26. The electrical assembly according to claim 25, wherein said first cutout section and said second cutout section are semicircular in shape, respectively.

27. An electrical assembly comprising:

a circuit board having a first surface;

a first electrically conductive portion formed on said first surface;

a through hole formed in said circuit board in said first electrically conductive portion for receiving an electrical connection;

a first through slot formed in said circuit board and opening into said through hole; and a second through slot formed in said circuit board and opening into said through hole, wherein a portion of said circuit board residing between said first through slot and said second through slot is flexible.

* * * * *